United States Patent [19]

McNutt

[11] 4,321,584
[45] Mar. 23, 1982

[54] CHARGE COUPLED DIGITAL-TO-ANALOG CONVERTER

[75] Inventor: Michael J. McNutt, Yorba Linda, Calif.

[73] Assignee: Rockwell International Corporation, El Segundo, Calif.

[21] Appl. No.: 48,960

[22] Filed: Jun. 15, 1979

[51] Int. Cl.³ ............................................. H03K 13/02
[52] U.S. Cl. ........................... 340/347 DA; 307/221 D
[58] Field of Search .................. 340/347 DA, 347 M; 307/221 D; 357/24

[56] References Cited

U.S. PATENT DOCUMENTS

| | | | |
|---|---|---|---|
| 3,836,906 | 9/1974 | Ando | 340/347 DA |
| 3,913,077 | 10/1975 | Erb | 307/221 D |
| 4,126,852 | 11/1978 | Baertsch | 340/347 DA |
| 4,161,783 | 7/1979 | Wrench | 357/24 |
| 4,171,521 | 10/1979 | Wang | 307/221 D |
| 4,213,120 | 7/1980 | Buchanan | 340/347 DA |

FOREIGN PATENT DOCUMENTS 2383555  6/1978  France .......................... 340/347 DA

OTHER PUBLICATIONS

Mok", "Solid State Electronics", 1974, vol. 17, pp. 1147–1154.

*Primary Examiner*—Charles D. Miller
*Attorney, Agent, or Firm*—H. Fredrick Hamann; Daniel R. McGlynn

[57] ABSTRACT

A charge coupled digital-to-analog converter in which the digital input lines are connected to respective storage wells which store a predetermined amount of charge corresponding to the significance of the input line. A transfer gate is also provided for substantially simultaneously transferring and combining the charge packets to an analog output.

19 Claims, 4 Drawing Figures

CHARGE COUPLED DIGITAL-TO-ANALOG CONVERTER

BACKGROUND OF THE INVENTION

The invention relates to digital-to-analog converters, and in particular, to digital-to-analog converters constructed using charge coupled device technology.

Several techniques are known in the prior art for performing a digital to analog conversion. The most common technique is through the use of a resistor network. Such digital-to-analog converters are usually implemented as hybrid circuits and therefore consume a large amount of space and consume a considerable amount of power. These prior art digital-to-analog converters are therefore relatively expensive in applications such as signal processing where a large number of channels are present. The applications also require a digital-to-analog converter which uses compatible technology with signal processing devices such as demultiplexers, delay lines, transient data records, filters, and processors, and which can be integrated on chip with such devices. Additional problems which are present in signal processing devices which cannot be handled by existing digital-to-analog converters are large variations in the binary input signal levels which require elaborate tuning or trimming of the individual bit elements. Moreover, in some prior art D-A converters, the effects of input signal variations are suppressed by using the input signals to operate arrays of transistors which switch a reference voltage through the resistor network. This requires a large number of separate transistors, some of which require inverted input signals or gated combinations of two or more input signals.

U.S. Pat. No. 4,107,670 describes one type of charged coupled digital-to-analog converter using a reference charge generator for producing charge portions. Such a technique is fairly complicated and not suitable for many applications.

Prior to the present invention there has not been any simple and easy to use digital-to-analog converter using charge coupled device technology.

SUMMARY OF THE INVENTION

Briefly, and in general terms, the invention is concerned with a digital to analog converter implemented with charge coupled device technology. The device provides a series of electronic potential wells having charge storage areas which store charge in an amount proportional to the significance of the binary input bit which such storage areas represent. The areas are defined on a wafer of semiconductor material during the fabrication process by masks, and are therefore permanently fixed in dimension. An important feature of the present invention is that the depths of the potential wells are determined not by the precise magnitude of the input signals but by two gates which are common to each of the wells. These gates function to lock in the relative sizes of each of the potential wells and thus their charge storage capacity. Such a feature eliminates the need for individual tuning of each of the wells. The charge storage well is filled by a 1 binary data input signal, and the charge storage well is left empty by a 0 input signal. Such definitions of the storage of the wells therefore eliminate the need of precisely defined input signal levels. If the fill threshold of a given well is exceeded by an input signal of relatively large amplitude, the excess charge is automatically removed by means provided by the present invention, so that the input signal amplitude is not critical. A transfer gate is also provided so that the charges in the various potential wells can be combined or summed to form a potential on an output gate. Such a signal can then be coupled to another charge coupled device or amplified to form an output signal.

DESCRIPTION OF THE PREFERRED EMBODIMENT

Figure 1:
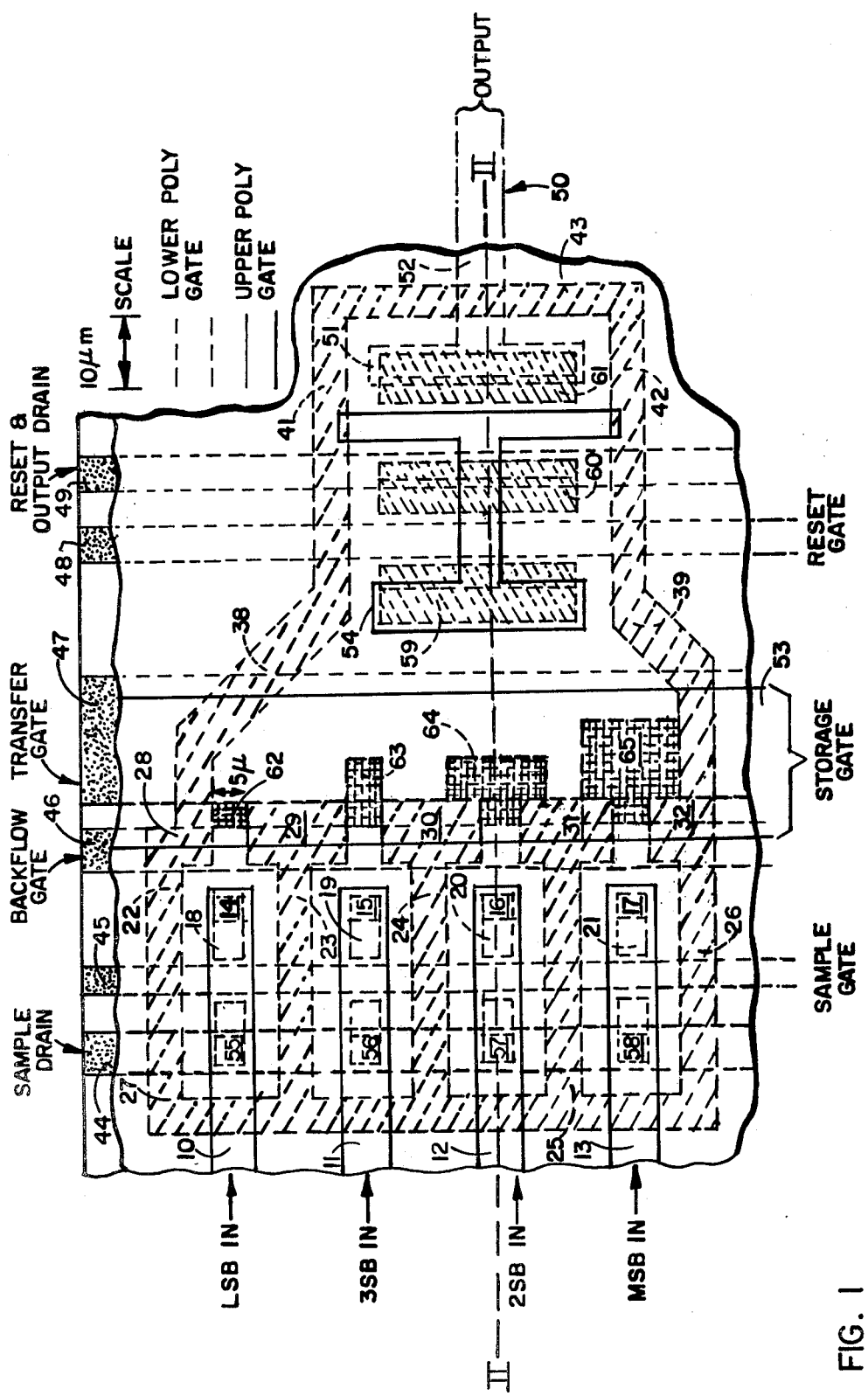
FIG. 1 is a plan view of a four bit charge coupled digital to analog converter according to the present invention.

Turning now to FIG. 1 there is shown a plan view of a silicon integrated circuit for implementing a four-bit charge coupled device (CCD) digital-to-analog converter according to the present invention.

The present invention is implemented on a body of semiconductor material of a first conductivity type. The semiconductor body includes first semiconductor regions of a second conductivity type adjacent the major surface extending from the surface to a predetermined depth into the body. A plurality of channels in the semiconductor body are formed by such first semiconductor regions through which charges can be caused to flow when the circuit elements are appropriately biased.

In the preferred embodiment of the present invention, the body of semiconductor material is of p-type, with a layer of n-type semiconductor material formed by implantation of a dopant species lying thereover. An insulating layer is disposed over the n-type material layer. Four upper level polysilicon digital bit lines 10, 11, 12 and 13 carry the data input signals of a digital number to be converted into an analog signal to corresponding n+ silicon contacts 14, 15, 16, and 17 respectively, and from there the signals are transferred to the corresponding n+ regions 18, 19, 20, and 21. A p+ channel stop or boundary region is defined by the elongated p+ regions 22, 23, 24, 25, and 26; p+ regions 28, 29, 30, 31, and 32 connected respectively thereto, and another elongated p+ region 27 extending normal to the regions 22–26, surround at least in part the n+ regions 18, 19, 20 and 21. The elongated regions 28 and 32 join another p+ channel stop region 38 and 39 respectively. The remaining n-type region between the p+ regions 28 and 29, 29 and 30, 30 and 31, and 30 and 32 form regions 34, 35, 36, and 37 respectively which define at least a portion of the charge storage well according to the present invention.

The p+ channel stop regions 38 and 39 converge towards one another so as to restrict the n-type region 40. The regions 38 and 39 are continued into elongated p+ channel stop regions 41 and 42, which in turn connect to another elongated p+ channel stop region 43 disposed normal to regions 41 and 42. The circuit according to the present invention is therefore circumferentially completely enclosed by a p+ channel stop well formed by segments 27, 22, 28, 38, 41, 43, 42, 39, 32, and 26. The entire circuit according to the present invention is implemented within the interior of such a p+ channel stop region implemented on the major surface of a silicon substrate.

The device according to the present invention has been implemented with two level polysilicon gate technology. There are shown a number of gate regions which are formed by either upper or lower polysilicon elongated chips, disposed on an oxide layer over the silicon surface. More particularly, FIG. 1 shows the sample drain 44, the sample gate 45, the backflow gate 46, the transfer gate 47, the reset gate 48, the reset and output drain 49, and the output 50. The gates 44–49, and the output 50, are all first or lower level polysilicon formed as elongated strips arranged over corresponding areas of the silicon substrate. The output 50 consists of a first elongated contact strip 51 which extends parallel to the elongated strips 44–49 together with a second elongated strip 52 which is connected to the first elongated strip 51 and extends in a direction normal thereto. An upper or second level polysilicon layer is also provided, including the storage gate 53 which extends parallel to gates 44 and 49, and also extends at least in part over portions of the backflow gate 46 and the transfer gate 47. The second level polysilicon layer also forms the output gate 54 and the input lines 10–13.

FIG. 1 also shows a plurality of n+ wells 55, 56, 57, and 58 contacted by the sample drain 44, an n+ well 59 contacted by the output gate 54, an n+ well 60 contacted by the output and reset drain 49, and an n+ well 61 contacted by the output 51.

Figure 2:
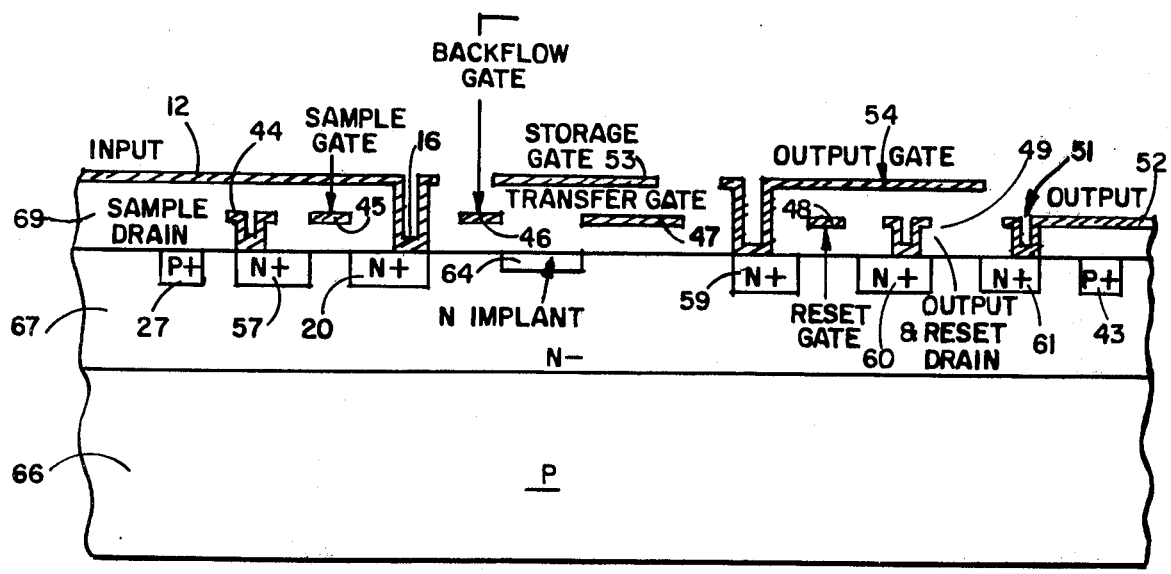
FIG. 2 is a cross-sectional view of the four bit charge coupled digital to analog converter through the II—II plane in FIG. 1.

FIG. 2 is a highly simplified cross-sectional view of the digital-to-analog converter shown in FIG. 1 through the II—II plane indicated by a dotted line in FIG. 1. The converter according to the present invention is preferably implemented on a body of semiconductor material formed with a plurality of channels along which charge may be propagated. The converter is preferably implemented on a substrate 66 of semiconductive material of a second type conductivity on which a layer of semiconductor material 67 of a first type conductivity is provided. In the preferred embodiment according to the present invention the substrate material 66 is of p-type conductivity while the layer 67 is of n-type material. Disposed on the n-layer 67 is a layer of silicon oxide 69. The silicon oxide functions to isolate the various gates such as the sample gate, the backflow gate 46, the storage gate 53, the transfer gate 47, and the reset gate 48 from the silicon layer 67. In a preferred embodiment according to the present invention, the layer 67 is an implanted layer disposed on the semiconductor substrate 66. The analog conversion area 64 is defined as the area between the backflow gate and the transfer gate where charge can accumulate in an n implanted region. Such a region is defined on two sides by portions 30 and 31 of the p+ channel stop, on one side by an edge of the backflow gate 46, and on the other side by an edge of the transfer gate 47. The analog conversion area 64 is formed by a distinct semiconductor region which has a first or n-type forming dopant concentration higher than that of the layer 67 but lower than that of the n+ wells 55, 56 (shown in FIG. 1), 57, and 58 (shown in FIG. 1). The transfer gate has notches of various sizes extending into the area thereof (corresponding to the regions 62, 63, 64 and 65 and shown more particularly in FIG. 1) so as to provide a different area for the charge storage well corresponding to the different bit input lines defined by the channels defined by the edges of the p+ channel stops 28 and 29, 29 and 30, 30 and 31, and 31 and 32. The analog conversion area or charge storage well corresponding to the least significant bit is a rectangular parallelopiped shown in top view in FIG. 1 as a square with an edge approximately 5 microns in length. This charge storage area 62 stores a predetermined amount of charge determined by the equation $Q=CV$, where V is equal to voltage on the storage gate minus the voltage on the backflow gate ($V_{SG} - V_{BG}$), and the capacitance C is equal to the dielectric constant of the oxide divided by the thickness of the oxide times the area ($\epsilon_{ox}/t_{ox}A$) and is approximately equal to $5 \times 10^{-15}$ farads. The voltage difference is approximately 1 volt, so the amount of charge stored in the area 62 is approximately $5 \times 10^{-15}$ coulombs.

The area of charge storage area 63 is defined to be precisely twice the area of the charge storage area 62, and therefore is intended to store exactly twice the amount of charge as stored in the area 62. The area 63 is therefore associated with the next most significant bit of the digital signal to be converted into an analog signal. Since the digital signals are representative of powers of two, it is clear that the amount of charge stored in the area 63 is an analog representation of the digital signal applied to the input 11, whereas the amount of charge stored in the area 62 is an analog representation of the digital signal applied to the input line 10, since the digit applied on input line 11 represents twice the quantity of the signal applied on input line 10.

Such an analysis may proceed with further charge storage areas 64, 65, and so on. The total number of charge storage areas which are possible is limited by the charge storage area of the least significant bit, and the corresponding tolerance associated with the edges of the channel stop, the backflow gate, and the transfer gate at the charge storage area of the most significant bit. Once the production tolerances of the edges of the charge storage areas increase to a magnitude such that the tolerance results in a possible variation in area in the charge storage well of the most significant bit equal to more than half the area of the charge storage well of the least significant bit that is, half the area of charge storage well 62, the limit of the number of bits of accuracy of the digital-to-analog converter has been reached. The present example of FIG. 1 shows a four bit CCD digital-to-analog converter for simplicity, but it must be realized that six bit, eight bit and higher order digital-to-analog converters may be implemented with present day production technology as well.

Turning again to FIG. 2, there is shown a p-type conductivity silicon substrate 66, an n- type epitaxial or ion implanted layer 67 disposed on the p type substrate 66, and various ion implanted or diffused regions 27, 57, 20, 64, 59, 60, 61, and 43 located on the major surface of the epitaxial layer 67. Disposed on the epitaxial or implanted layer 67 is a layer of oxide 69 on which are formed the sample drain 44, the sample gate 45, the backflow gate 46, the transfer gate 47, the output gate 54, the reset gate 48, the output and reset drain 49 and the output 51-52. As is shown in FIG. 2, the sample drain 44 makes electrical contact with the n+ region 57, the input 12 makes electrical contact with the n+ region 20, the output gate 54 makes electrical contact with the n+ region 59, the output and reset drain 49 makes contact with the n+ region 60, the output 51 makes contact with the n+ region 61 all through holes etched in the oxide. Another oxide layer is grown on the first polysilicon layer and a second level of polysilicon is formed by the storage gate 53, the output gate 54 and the input lines 10-13.

Figure 3:
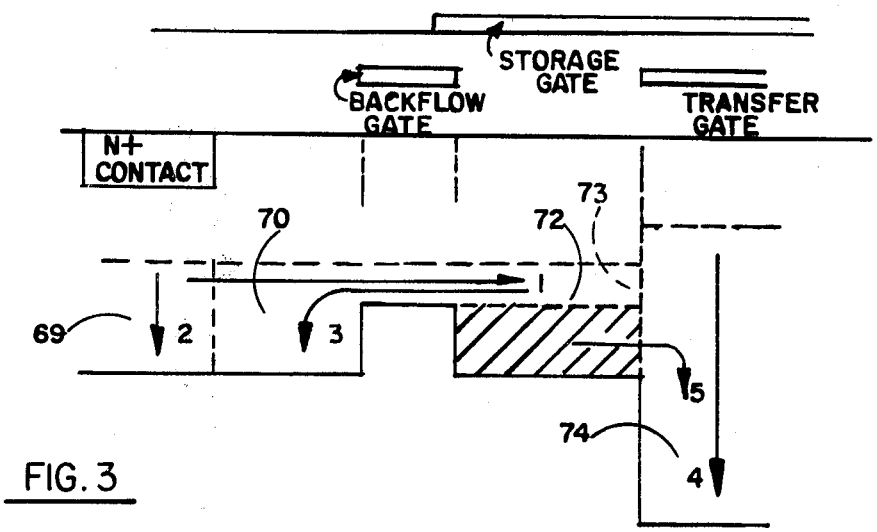
FIG. 3 is a potential diagram showing the formation of the analog charge packet in the semiconductor material between the n+ input contact and the transfer gate.

Turning now to FIG. 3, there is shown a potential diagram showing the potential in the region between the n+ input contact (10-13) and transfer gate, and the formation of the analog charge packet in one (e.g. 64) of the n- type semiconductor regions located between the backflow gate and the transfer gate. The top portion of FIG. 3 shows a highly simplified diagramatic view of the cross section of the silicon wafer between the n+ contact and the transfer gate. Directly below such a representation is a potential diagram showing the relative levels of the electrical potential in the silicon wafer at the position corresponding to the locations of the elements shown directly above the diagram. The backflow gate is biased at a medium potential and the transfer gate is biased to a very high potential. Overlapping the backflow and transfer gates is an upper level polysilicon storage gate biased to a very low potential which functions to define the bottoms of the potential wells. Although the actual bias means is not shown in the diagram, it is assumed that one skilled in the art would be able to provide appropriate contacts to the various gates and connect such contacts to a source of potential so that the gates are biased in the appropriate manner. Such sources of electrical potential or contacts are not shown in the drawing for simplicity.

A stable reference voltage source is easily obtainable for the analog signal generating backflow and charge storage gates in the present invention since they are simple capacitors which would suppress voltage fluctuations. No time varying signals are applied to these lines.

The potential diagram of FIG. 3 further illustrates the formation of the analog charge packets in the storage areas. If a binary 1, represented by a negative potential or a packet of electronic charge, is input on a particular digital data line, it raises the potential on the n+ contact and injects electrons over the backflow potential 71 of the corresponding storage well, as shown by the arrow labeled 1 in FIG. 3. If on the other hand the input data line represents a binary 0, then the potential on the n+ contact remains low and no charge is injected into the well. Reference may be made at this point to FIG. 4 which shows a timing diagram of the voltage level of signals present on the various gates shown in FIG. 1. Assuming that circuit is implemented with n-channel technology, when the sample gate is switched on by a relatively low electron potential or a relatively positive voltage, the n+ data line contacts to a constant low potential at the commonly connected n+ sample drains. The result is that the potential in the region 69 the n+ data line contact is dropped, shown by the arrow labeled 2 in FIG. 3. The former potential is shown by the dotted line at the tail of the arrow while the new potential is shown by the solid line at the head of the arrow labeled 2. Any charge in the storage well at a potential higher than the backflow potential will then flow back into the region 70 as shown by the arrow labeled 3, and eventually to the sample drain. Charge remaining in the storage wells shown by the cross-hatched area 72 beneath the storage gate is proportional to the difference between the fixed dc potentials established under the backflow and the storage gates common to all the wells. We have noted this above when we pointed out the charge was proportional to the capacitance times the voltage, where the voltage was the difference between the potential on the storage gate and the potential on the backgate. The charge is also proportional to the capacitance, that is the storage well area which is defined by the geometry or layout of the transfer gate. According to the present invention, such a geometry or layout is designed to be directly proportional in area to the particular bit significance of the well and the corresponding input line.

One of the important features of the present invention is that the precise amplitude of the binary input signal is not critical to determining the amount of charge stored under the storage gate corresponding to the analog signal to be generated by the digital signal. This is a major improvement achieved by the present invention over prior art digital-to-analog conversion techniques. In the prior art the magnitude of the analog signal may be directly related to the exact amplitude of the binary input signal and therefore such prior art D/A converters were particularly sensitive to noise, voltage fluctuations, or varying bias or power supplies. The present invention overcomes the limitations of prior art D/A converters by providing the source of the analog charge from the geometry of the semiconductor layout, which is fixed at the time of fabrication and does not vary depending upon the applied voltages.

In the present invention, a threshold level is established so that as long as the 0-bit potential is less than the backflow gate potential and the 1-bit potential is greater than the backflow gate potential, the correct analog conversion will be made. The sample time aperture is the time in which the sample gate is turned off for allowing the data line n+ contact to follow the input signal.

After the excess charge has been removed from the storage well over the backflow gate, or equivalently after equilibrium has been established, the potential in the region 73 beneath the transfer gate is lowered as shown by the arrow labelled 4 in FIG. 3. This is also shown as a pulse in the timing diagram in FIG. 4d. At this time the various charge packets which were previously stored under the storage gate now flow out of the storage gate in the direction of arrow 5 into the area of lower potential. The various charge packets from the storage cells corresponding to different significant bits then flow together into a single analog charge output. The charge output can be used in a charge coupled integrated circuit chip or alternatively may be power amplified to drive off chip analog loads.

FIG. 2 shows a typical implementation of an output buffer with a reset type circuit. In this circuit the charge flows first to an n+ contact which is associated with an output FET composed of regions 61 and 60, and gate 54. The output FET controls the flow of electrons from the output n+ source 61 to an n+ drain 60. When an output pulse has been established for a sufficient length of time, the lower polysilicon reset gate 48, which has been turned off during the output pulse, is now turned on to drain the charge from the output gate 54 through its n+ contact 59 through the channel region under the reset gate 48 and into the n+ reset drain 60. The purpose of this removal of the output gate charge is to reset the output gate 54 to a relatively low potential in anticipation of the next analog charge signal. The timing diagram as shown in FIG. 4 enables this entire operation to be carried out within the time period when a single bit is applied to the input 12.

Figure 4:
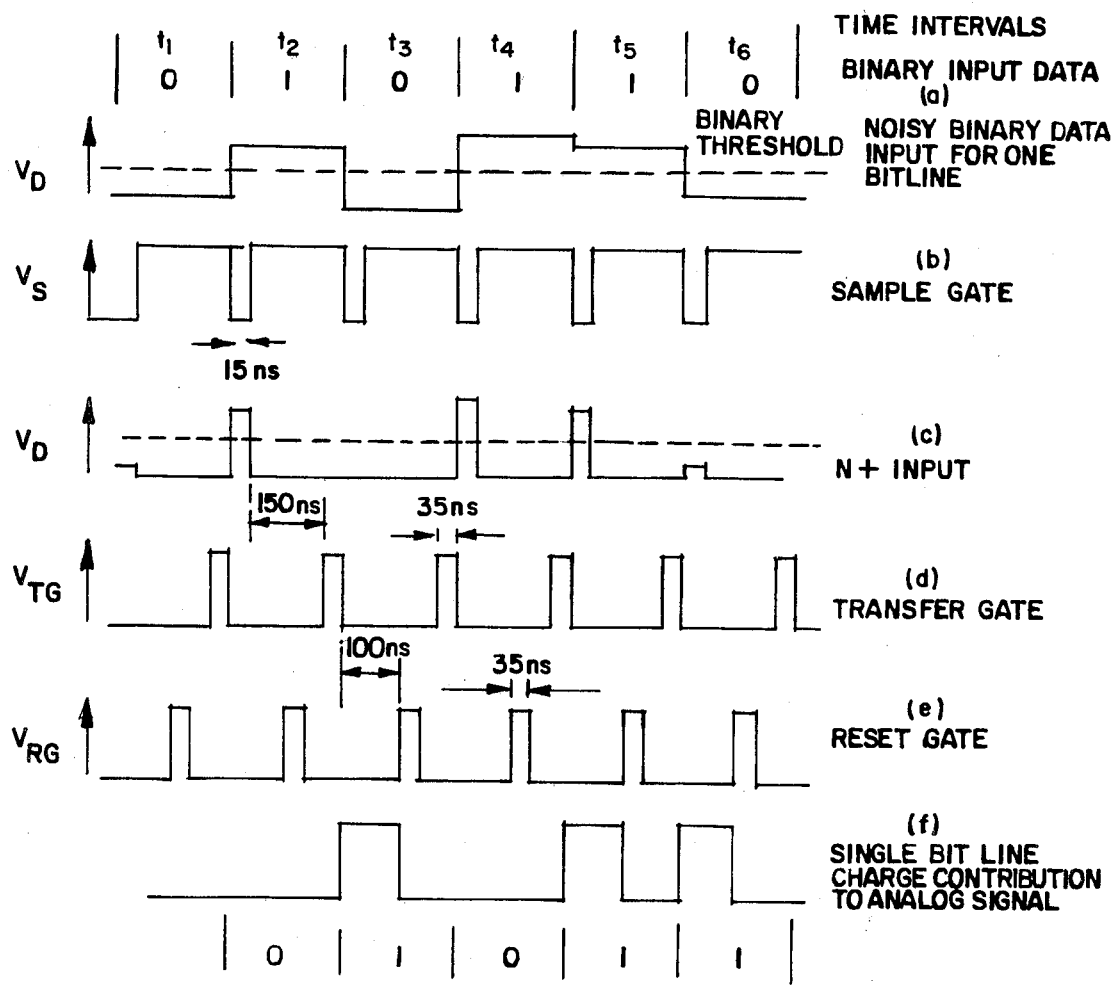
FIG. 4 is a timing diagram of signals present on various terminals of the device.

Turning now to FIG. 4, there is shown a timing diagram for the various signals present in the circuit shown in FIG. 1.

The top line of FIG. 4 shows how time is broken into equal intervals or periods labelled $t_1$, $t_2$, $t_3$, $t_4$, $t_5$ and $t_6$. Each one of these time intervals is known as a "bit cell" because during such a time interval data corresponding to a single input bit is simultaneously provided to each of the inputs of the digital-to-analog converter. For the purpose of our analysis, it is irrelevant whether the bit significance of the bit input under consideration is the least significant bit (LSB), the most significant bit (MSB), or a bit of intermediate significance.

The next line shows the electrical representation of the input signal (including noise) for the one input line corresponding to the binary input data defined immediately above the signal. All voltages are denoted positive by arrow direction. Positive voltage denotes negative electron potential. A binary threshold (i.e. the backflow gate potential) which distinguishes between a binary-0 level signal and a binary-1 level signal is shown by a horizontal dotted line. The signal is noisy since it is evident that the amplitude of the signal is not uniform for each binary 1 or binary 0. In FIG. 4 $V_D$ is the nominal binary voltage range and $-V_S$ is the sample gate pulse voltage. The convention used here is that a binary-1 signal is represented by a relatively positive potential or negative voltage, while a binary-0 signal is represented by a relatively negative potential.

The next line in FIG. 4 shows the voltage applied to the sample gate during the operation of the present invention. It is noted that at the beginning of each bit cell, the voltage of the sample gate is pulsed $-V_S$ below its dc bias level for a period of at least 15 nanoseconds, which allows the input region 20 to become charged with the input signal of the input line 12. Here the second most significant bit is being used as the timing diagram example.

The signal on the n+ input 20 is shown in the next timing diagram. The horizontal dotted line shows the charge injection threshold allowing charge to flow in the direction of the arrow 1 in FIG. 3. It is seen from FIG. 4 that the charge injection threshold is exceeded during the time intervals $t_2$, $t_4$, and $t_5$ corresponding to binary 1 bits, while the charge injection threshold is not exceeded during time intervals $t_1$, $t_3$, and $t_6$.

The next timing diagram shown in FIG. 4 is the signal applied to the transfer gate. A minimum of 115 nanoseconds after the end of the pulse on the sample gate, an impulse is applied to the transfer gate for transferring the charge from the n implant 64 to the n+ region 59 and the output gate 54. A minimum time period of 150 nanoseconds is required for allowing equilibrium in the storage cells to be obtained. The minimum time for the pulse on the transfer gate is shown to be 35 nanoseconds.

The next line in the timing diagram shown in FIG. 4 is the signal applied to the reset gate 48 for resetting the n+ region 59. The reset gate functions so that the n+ region is ready to receive the next charge packet. The minimum time interval between the pulse on the transfer gate and the pulse for the reset gate operation is 100 nanoseconds. The minimum duration of the pulse on the reset gate is shown to be 35 nanoseconds.

The last line in the timing diagram in FIG. 4 is a representation of the single bit line charge contribution to the analog signal. It is seen that between the time period of the pulse on the transfer gate and the time period of the pulse on the reset gate, a charge packet flows which forms a charge contribution to the analog signal which is noted. It is noted that there is no charge contribution during the bit cell times corresponding to a binary 0 bit. The output is always delayed one bit cell from the input.

The bit storage areas in the device can be more precisely controlled by preferably implanting a shallow layer of arsenic in the lightly doped N- channel. The implant may be 0.2–0.4 μm deep with a doping around $5 \times 10^{16}$ cm$^{-3}$, so that the charge storage in the shallow implant dominates over that of the $5 \times 10^{14}$ cm$^{-3}$ doped 3 μm deep implant or epitaxial channel. A 0.5–1.0 μm border would be left between the implanted region and the channel stops and gate edges. Since the charge stored in these border regions would be negligible compared to that in the implanted areas, the layer provides an excellent buffer against process variations in the P+ channel stop diffusions and the gate etching. The use of the very slowly diffusing arsenic species insures that the implanted profile will not vary during subsequent processing.

It is possible to produce higher order digital-to-analog converters according to the technique of the present invention by implementing the digital-to-analog circuits in mutually separated semiconductor island on the surface of a common semiconductor body. Each of the semiconductor island will be defined by an outer wall formed by a zone of semiconductor material having a relatively high dopant concentration, such as a p+ channel stop in an n type semiconductor wafer. Each of the islands accommodate a plurality of semiconductor surface elements adjacent a major surface of the body as taught by the above description of a 4-bit CCD digital-to-analog converter. A first one of the islands can include a plurality of charge coupled device channels, such as four, in which charges are capable of moving through the substrate when appropriately biased. The first island includes a digital-to-analog converter for a digital signal of K successive digits, where in the present example K is equal to 4. The first island handles the four least significant bits of a digital number to be converted into an analog signal. A second one of the islands is disposed adjacent the first island, the second island comprising a digital-to-analog converter of L successive significant digits, where the set of L significant digits are successive to the set of K significant digits, that is, the L significant digits are directly successive digits to the K significant digits in the first island. As an example, if the first island had the least significant digits 1, 2, 3, and 4, the second island would have successively higher digits 5, 6, 7, and 8. The eighth significant digit will then be the most significant digit of an 8-bit digital word to be converted in an analog signal.

In order to use the construction described in the preceding paragraph, it is necessary that a voltage difference exist between the analog output signal derived from the first island and from the second island. More particularly, one can state that in the present example the digital signal applied on the output of the fifth significant digit (i.e., the first channel in the second island) must be $2^4$ times as great as the analog signal applied on the output of the first or least significant digit (i.e. the first channel on the first island). This voltage level difference may be achieved by providing a different potential difference between the storage gate and the backflow gate in the first and second islands, since it is such potential difference which determines the magnitude of the charge stored in the potential well. The potential difference is specified so that the difference in the second island is $2^4$ times as great as in the first island. It must be further noted that the signal-to-noise ratio must be sufficiently high so that the output signal obtained from the island with the lower voltage is not lost in the noise signal.

The speed of the D-A conversion is primarily limited by the speed of the charge equilibration or the removal of the excess charge in the storage wells. The initial charge injection over the backflow gate potential barrier is very fast since it is strongly field aided. Experimentally, injection over barriers as wide as 15 μm takes only 9 ns. The following equilibration of the excess charge flowing back over the backflow gate, however, ultimately occurs by thermal diffusion which is fairly slow. A good approximation for the time constant, $\tau_{th}$, that describes the exponential decay of the excess charge is $\tau_{th} = 4L^2/\pi^2 D_n$, where L is the distance across the backflow and storage region and $D_n$ is the thermal diffusion coefficient for electrons. In the 4-bit circuit considered, one has $L \approx 17$ μm for the most significant bit (MSB), and $D_n$ is typically 25 cm$^2$/s in a moderately doped N-type layer at 300° K. This gives $\tau_{th} \approx 50$ ns., and, if one demands $e^{-3}$ or less fractional error in the equilibration, then one will need 150 ns. Adding the 150 ns. required for the charge equilibration to a liberal allowance of 15 ns. for the charge injection or input sampling aperture and 35 ns. for the analog charge flow across the transfer gate when its potential is lowered gives a 200 ns. period or a 5 MHz D-A conversion frequency.

This frequency is proportional to $L^{-2}$, since all three of the carrier transit times are approximately proportional to $L^2$. This means a drastic reduction in conversion frequency as more bits are added to the device, since the most significant bit storage area is increased a factor of 2 for every additional bit. Thus, L is increased approximately a factor of $\sqrt{2}$ and the conversion frequency is decreased approximately a factor of two for this additional bit. Therefore, a 5-bit D-A converter would operate at about 2.5 MHz and a 6-bit converter would be accurate up to around 1.2 MHz. All these numbers assume the 5 μm minimum dimensions indicated in FIG. 1.

One technique which would allow 4-6 bit D/A converters according to the present invention to operate at much higher speeds should be mentioned. For example, a 6-bit unit that can be divided into two 3-bit devices would only require $L \approx 12$ μm or $\tau_{th} \approx 23$ ns. The total injection, equilibration and transfer time would be 100 ns, giving a 10 MHz conversion rate. However, the voltage differences between the backflow and storage gates in the two 3-bit units would have to differ by a factor $2^3 = 8$ and be precisely controlled. In many cases of high performance, limited production units, this tradeoff between higher speed and additional tuning would probably be made. Such a technique of implementing a 6-bit device as two 3-bit devices can be done in separate semiconductor islands, as described earlier.

It will be obvious to those skilled in the art that the semiconductor device according to the present invention can be manufactured with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used. Furthermore, the conductivity types in the embodiment may be interchanged and corresponding to which, the polarity of the operating voltages are to be adapted. Moreover, the voltage level and the static or dynamic nature of the signals applied to the various terminals and gates of the device, as well as the voltage sources, may be suitably selected as desired for a particular application.

I claim:

1. A charge coupled digital-to-analog converter having a plurality of digital input lines with successive significance levels, and an analog output line, comprising:

a body of semiconductor material of a first conductivity type and having a major surface including a plurality of integrated circuit elements;

a first semiconductor region of a second conductivity type adjacent said major surface and extending from said surface to a predetermined depth into said body, said first region forming a plurality of channels in said semiconductor body through which charges can be caused to flow when said circuit elements are appropriately biased;

sample gating means connected to said plurality of digital input lines for simultaneously sampling the digital input bits;

said sample gating means comprising a transistor device implemented on said body of semiconductor materials having its conduction path connected between one of said digital input lines and a corresponding one of said plurality of channels in said body;

a plurality of second semiconductor regions of said first conductivity type adjacent said major surface in each of said channels, said second region having a first conductivity type forming dopant concentration higher than that of said body;

a plurality of input means connected to respective ones of said second semiconductor regions for applying a predetermined electric charge thereto;

an ordered plurality of third semiconductor regions of said first conductivity type in said semiconductor body adjacent said major surface and located at the termination of said first plurality of channels, said third region having a first conductivity type forming dopant concentration higher than that of said body but less than that of said second semiconductor regions;

said third semiconductor regions forming a plurality of storage wells, each of said storage wells functioning to store a predetermined amount of electronic charge in the form of a charge packet, the location of said storage wells and said amount of electronic charge being defined by the relative locations of a first edge formed by a single transfer gate overlying said body of semiconductor material, said single transfer gate including a plurality of notches, each notch corresponding to a different one of said storage wells, the normal projection of each notch into said semiconductor body defining a peripheral edge of said respective storage well; and a second substantially linear opposite edge, formed by a single backflow gate overlying said body of semiconductor material, said amount of electronic charge corresponding to the bit significance of the corresponding input bit lines;

each of said ordered third semiconductor regions having a cross-sectional area measured in a plane parallel to said major surface which increases with each successive ordered region, the dimension of said area in which successive region increasing both in a direction parallel to said channel direction, and in a direction perpendicular to said channel direction;

a fourth semiconductor region of said first conductivity type in said semiconductor body adjacent said major surface and disposed adjacent said third semiconductor region, said fourth region having a first conductivity type forming dopant concentration substantially the same as said second region; and biasing means to cause charge flow through said channels, said biasing means including first transfer means for transferring charge from each of said second semiconductor regions to respective ones of said third semiconductor regions during a first time interval until charge equilibrium has been established; and second transfer means for substantially simultaneously transferring charge from each of said third semiconductor regions to said fourth semiconductor region during a second subsequent time interval thereby accumulating the charge from all of said charge storage regions.

2. A digital-to-analog converter as defined in claim 1, wherein said transistor device is an n-channel MOS field effect transistor.

3. A digital-to-analog converter as defined in claim 1, wherein said monolithic circuit comprises a p+ channel stop surrounding at least in part each of said plurality of storage wells.

4. A digital-to-analog converter as defined in claim 1, further comprising a backflow gate which forms a portion of the edges of each of said storage wells.

5. A digital-to-analog converter as defined in claim 1, further comprising an output gate connected to said transfer gate for receiving the charge packets transferred by said transfer gate from each of said storage wells.

6. A digital-to-analog converter as defined in claim 5, further comprising a reset gate for draining the charge from said output gate after said charge packet has been transferred thereto.

7. A charge coupled digital-to-analog converter having a plurality of digital input lines with successive significance levels, and an analog output line, comprising:

a body of semiconductor material of a first conductivity type and having a major surface including a plurality of circuit elements;

a first semiconductor region of a second conductivity type adjacent said major surface and extending from said surface to a predetermined depth into said body, said first region forming a plurality of channels in said semiconductor body through which charges can be caused to flow when said circuit elements are appropriately biased;

a plurality of second semiconductor regions of said first conductivity type adjacent said major surface in each of said channels, said second region having a first conductivity type forming dopant concentration higher than that of said body a plurality of input means connected to respective ones of said second semiconductor regions for applying a predetermined electric charge thereto;

an ordered plurality of third semiconductor regions of said first conductivity type in said semiconductor body adjacent said major surface and located at the termination of said first plurality of channels, said third region having a first conductivity type forming dopant concentration higher than that of said body but less than that of said second semiconductor regions;

said third semiconductor regions forming a plurality of storage wells, each of said storage wells functioning to store a predetermined amount of electronic charge in the form of a charge packet, the location of said storage wells and said amount of electronic charge being defined by the relative locations of a first edge formed by a single transfer gate overlying said body of semiconductor material, said single transfer gate including a plurality of notches, each notch corresponding to a different one of said storage wells, the normal projection of each notch into said semiconductor body defining a peripheral edge of said respective storage well; and a second substantially linear opposite edge, formed by a single backflow gate overlying said body of semiconductor material, said amount of electronic charge corresponding to the bit significance of the corresponding input bit lines;

each of said ordered third semiconductor regions having a cross-sectional area measured in a plane parallel to said major surface which increases with each successive ordered region, the dimension of said area in each successive region increasing both in a direction parallel to said channel direction, and in a direction perpendicular to said channel direction;

a fourth semiconductor region of said first conductivity type in said semiconductor body adjacent said major surface and disposed adjacent said third semiconductor region, said fourth region having a first conductivity type forming dopant concentration substantially the same as said second region; and biasing means to cause charge flow through said channels, said biasing means including first transfer means for transferring charge from each of said second semiconductor regions to respective ones of said third semiconductor regions during a first time interval until charge equilibrium has been established; and second transfer means for substantially simultaneously transferring charge from each of said third semiconductor regions to said fourth semiconductor region during a second subsequent time interval thereby accumulating the charge from all of said charge storage regions.

8. A charge coupled device comprising in combination:

a body of semiconductor material of a first conductivity type and a first dopant concentration and having a major surface including a plurality of discrete channels in said body adjacent said major surface along which charge may be propagated;

an insulating layer deposited upon said major surface of said body of semiconductor material;

a plurality of digital input conductor lines overlying said major surface for providing respective digital input signals with successive significance levels, each of said digital input lines making electrical contact with a respective one of said channels;

sampling means for sampling the signals on respective ones of said digital input lines, the sample signals being constituted by electrical charges capable of moving in said channels;

a plurality of semiconductor regions of said first conductivity type but of a second dopant concentration higher than said first formed in each of said channels in said body, each of said regions having a precisely defined cross-sectional area as measured in the plane parallel to said major surface, and forming and storing a predetermined quantity of electronic charge during a first time interval, said quantity corresponding to the sample signal derived from the respective digital input line and the respective significance level thereof;

the location of each of said semiconductor regions and said predetermined quantity of electronic charge being defined by the relative locations of a first edge formed by a single transfer gate overlying said body of semiconductor material, said single transfer gate including a plurality of notches, each notch corresponding to a different one of said storage wells, the normal projection of each notch into said semiconductor body defining a peripheral edge of said respective storage well; and a second substantially linear opposite edge, formed by a single backflow gate overlying said body of semiconductor material;

transfer means disposed on said major surface adjacent to each of said channels for combining the stored charges from each of said channels during a second subsequent time interval;

output means disposed adjacent to said transfer means on said major surface and functioning to store said accumulated charge derived from said channels during a third predetermined time, the charge stored on said output means being an analog representation of the digital signal applied to said digital input lines during said first predetermined time.

9. A device as defined in claim 8 wherein said plurality of channels extend along said major surface substantially in the row direction.

10. A device as defined in claim 8 wherein said sampling means comprises a field effect transistor in each one of said channels.

11. A device as defined in claim 10 wherein said sampling means further comprises a sample gate formed by an elongated strip extending substantially in the column direction and forming the gate electrode of each respective one of said field effect transistors in each one of said channels.

12. A device as defined in claim 10 wherein said field effect transistor is an n-channel MOS field effect transistor.

13. A device as defined in claim 8 wherein said body of semi-conductor material comprises an n-type doped layer adjacent said major surface, and said charge storage region is formed by a heavily doped region in said layer.

14. A device as defined in claim 8, further comprising a storage gate disposed on said insulating layer over said charge storage region, and a backflow gate disposed on said insulating layer over said charge storage region, and spaced from said storage gate, said quantity of charge in each of said charge storage regions being determined by the potential difference between said storage gate and said backflow gate.

15. A device as defined in claim 14 wherein said storage gate and said backflow gate comprise conductive strips extending over said charge regions in each of said channels.

16. A device as defined in claim 8 further comprising a storage gate disposed on said insulating layer over said charge storage region, and a backflow gate disposed on said insulating layer over said charge storage region, and spaced from said storage gate, said quantity of charge in each of said charge storage regions being determined by the area of the respective one of said charge storage regions on said major surface of said semiconductor body, said area being defined as the area between said storage gate and backflow gate in said one charge storage region.

17. A charge coupled device comprising in combination:

a body of semiconductor material of a first conductivity type and comprising an n-type doped layer adjacent said major surface, having a major surface including a plurality of discrete channels in said body adjacent said major surface along which charge may be propagated;

an insulating layer deposited upon said major surface of said body of semiconductor material;

a plurality of digital input conductor lines overlying said major surface for providing respective digital input signals with successive significant levels, each of said digital input lines making electrical contact with a respective one of said channels;

sampling means for sampling the signals on respective ones of said digital input lines, the sample signals being constituted by electrical charges capable of moving in said channels;

a charge storage region formed by a precisely defined heavily doped region in said layer, formed in each of said channels in said body for forming and storing a predetermined quantity of charge during a first time interval, said quantity corresponding to the sample signal derived from the respective digital input line and the respective significance level thereof;

said charge storage region being defined by a plurality of semiconductor regions in said body defined by the relative locations of a first edge formed by a single transfer gate overlying said body of semiconductor material, said single transfer gate including a plurality of notches, each notch corresponding to a different one of said storage wells, the normal projecting of each notch into said semiconductor body defining a peripheral edge in said respective storage well; and a second substantially linear opposite edge, formed by a single backflow gate overlying said body of semiconductor material;

a storage gate disposed on said insulating layer over said charge storage region, and a backflow gate disposed on said insulating layer over said charge storage region, and spaced from said storage gate.

18. A monolithic integrated circuit comprising:

a common semiconductor body comprising a plurality of mutually separated semiconductor islands each of said island defined by an outer wall formed by a zone of semiconductor material having a relatively high dopant concentration, each of said islands accommodating a plurality of semiconductor circuit elements adjacent a major surface of said body, a first one of said islands including a plurality of charge coupled device channels in which charges are capable of moving through said substrate when appropriately biased and comprising:

a charge coupled digital-to-analog converter having a plurality of digital input lines with successive significance levels, and an analog output line, comprising sample gating means connected to said plurality of digital input lines for simultaneously sampling the digital input bits;

a plurality of storage wells connected to said sample gating means and functioning to store a predetermined amount of electronic charge in the form of a charge packet, said amount corresponding to the bit significance of the corresponding input bit line; and a transfer gate connected to said storage wells for substantially simultaneously transferring the charge packets stored in said plurality of storage wells to said analog output line for a digital signal of K successive digits; and a second one of said islands comprising a charge coupled digital-to-analog converter having a plurality of digital input lines with successive significance levels, and an analog output line comprising: sample gating means connected to said plurality of digital input lines for simultaneously sampling the digital input bits;

a plurality of storage wells connected to said sample gating means and functioning to store a predetermined amount of electronic charge in the form of a charge packet, said amount corresponding to the bit significance of the corresponding input bit line; and a transfer gate connected to said storage wells for substantially simultaneously transferring the charge packets stored in said plurality of storage wells to said analog output line of L successive significant digits wherein said set of L significant digits are successive to set of K significant digits where K and L are positive integers; and means interconnecting other circuit elements of said body with said charge coupled devices for initiating or utilizing the conduction of charges therethrough.

19. A monolithic integrated circuit comprising:

a common semiconductor body having a major surface and comprising a plurality of mutually separated semiconductor islands each of said islands defined by an outer wall formed by a zone of semiconductor material having a relatively high dopant concentration, each of said islands accommodating a plurality of semiconductor circuit elements adjacent a major surface of said body, a first one of said islands including a plurality of charge coupled device channels in which charges are capable of moving through said substrate when appropriately biased, each of said channels including a charge storage well defined as a region of said semiconductor body having a cross-sectional area in a plane parallel to said major surface which is an integral multiple of the cross-sectional area of a first charge storage well in one of said channels, said circuit elements comprising a digital-to-analog converter for a digital signal of K successive digits; and a second one of said islands including a plurality of charge coupled device channels in which charges are capable of moving through said substrate when appropriately biased, comprises a digital-to-analog converter to L successive significant digits wherein said set of L are positive integers; and means interconnecting other circuit elements of said body with said charge coupled devices for initiating or utilizing the conduction of charges therethrough.

* * * * *

UNITED STATES PATENT AND TRADEMARK OFFICE
CERTIFICATE OF CORRECTION

PATENT NO. : 4,321,584
DATED : March 23, 1982
INVENTOR(S) : Michael J. McNutt

It is certified that error appears in the above-identified patent and that said Letters Patent are hereby corrected as shown below:

In column 11, line 13, please delete "which" and insert --each--.

Signed and Sealed this

Twenty-seventh Day of July 1982

[SEAL]

Attest:

GERALD J. MOSSINGHOFF

Attesting Officer

Commissioner of Patents and Trademarks